(12) United States Patent
Murakami et al.

(10) Patent No.: US 11,551,961 B2
(45) Date of Patent: Jan. 10, 2023

(54) MULTI-ZONE PLASMA-ENHANCED CHEMICAL VAPOR DEPOSITION APPARATUS AND METHODS FOR OPERATING THE SAME

(71) Applicant: SANDISK TECHNOLOGIES LLC, Addison, TX (US)

(72) Inventors: Shoichi Murakami, Yokkaichi (JP); Shigeru Nakatsuka, Yokkaichi (JP); Syo Fukata, Yokkaichi (JP); Yusuke Osawa, Yokkaichi (JP); Shigehiro Fujino, Yokkaichi (JP); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 307 days.

(21) Appl. No.: 16/867,845

(22) Filed: May 6, 2020

(65) Prior Publication Data
US 2021/0351059 A1    Nov. 11, 2021

(51) Int. Cl.
*H01L 21/683* (2006.01)
*H01J 37/32* (2006.01)
(Continued)

(52) U.S. Cl.
CPC ........ *H01L 21/6833* (2013.01); *C23C 16/509* (2013.01); *H01J 37/3244* (2013.01);
(Continued)

(58) Field of Classification Search
CPC ............ H01L 21/6833; H01L 21/6831; H01L 21/6875; H01L 21/67248; H01L 21/67115;
(Continued)

(56) References Cited

U.S. PATENT DOCUMENTS

| 5,751,537 | A | * | 5/1998 | Kumar | ................ | H01L 21/6833 361/234 |
| 2005/0031796 | A1 | | 2/2005 | Wu et al. | | |
| 2008/0218931 | A1 | * | 9/2008 | Hsu | ................... | H01L 21/67259 361/234 |
| 2010/0209082 | A1 | | 8/2010 | He et al. | | |

(Continued)

FOREIGN PATENT DOCUMENTS

JP         02003921 A  *  1/1990

OTHER PUBLICATIONS

U.S. Appl. No. 16/535,505, filed Aug. 8, 2019, Western Digital Technologies, Inc.
(Continued)

*Primary Examiner* — Yuechuan Yu
(74) *Attorney, Agent, or Firm* — The Marbury Law Group PLLC (57) ABSTRACT

An apparatus includes an electrostatic chuck and located within a vacuum enclosure. A plurality of conductive plates can be embedded in the electrostatic chuck, and a plurality of plate bias circuits can be configured to independently electrically bias a respective one of the plurality of conductive plates. Alternatively or additionally, a plurality of spot lamp zones including a respective set of spot lamps can be provided between a bottom portion of the vacuum enclosure and a backside surface of the electrostatic chuck. The plurality of conductive plates and/or the plurality of spot lamp zones can be employed to locally modify chucking force and to provide local temperature control.

20 Claims, 5 Drawing Sheets

(51) Int. Cl.
  *H01L 21/67* (2006.01)
  *H01L 21/66* (2006.01)
  *C23C 16/509* (2006.01)

(52) U.S. Cl.
  CPC .. *H01J 37/32082* (2013.01); *H01J 37/32697* (2013.01); *H01J 37/32724* (2013.01); *H01L 21/67115* (2013.01); *H01L 21/67248* (2013.01); *H01L 22/26* (2013.01); *H01J 2237/24564* (2013.01); *H01J 2237/24585* (2013.01); *H01J 2237/3321* (2013.01); *H01J 2237/3323* (2013.01)

(58) Field of Classification Search
  CPC ............. H01J 37/3244; H01J 37/32174; H01J 2237/18
  See application file for complete search history.

(56) References Cited

U.S. PATENT DOCUMENTS

| | | | |
|---|---|---|---|
| 2013/0088808 | A1 | 4/2013 | Parkhe et al. |
| 2013/0126509 | A1 | 5/2013 | He et al. |
| 2015/0311105 | A1* | 10/2015 | Sadjadi ............. H01J 37/32715 438/798 |
| 2016/0027615 | A1 | 1/2016 | Ishiguro et al. |
| 2016/0336195 | A1 | 11/2016 | Fuse |
| 2017/0352726 | A1* | 12/2017 | Zhou ..................... H01L 21/324 |

OTHER PUBLICATIONS

U.S. Appl. No. 16/867,818, filed May 6, 2020, SanDisk Technologies LLC.
USPTO Office Communication, Non-Final Office Action for U.S. Appl. No. 16/867,818, dated Apr. 20, 2022, 18 pages.

* cited by examiner

MULTI-ZONE PLASMA-ENHANCED CHEMICAL VAPOR DEPOSITION APPARATUS AND METHODS FOR OPERATING THE SAME

FIELD

The present disclosure relates generally to the field of semiconductor manufacturing apparatuses, and particularly to multi-zone plasma-enhanced chemical vapor deposition apparatuses and methods for operating the same.

BACKGROUND

Plasma-enhanced chemical deposition (PECVD) apparatuses allow deposition of a film at a relatively low temperature by employing plasma to induce decomposition of a precursor gas. The deposition rate of the material during a PECVD process has non-uniformity caused by the gas flow pattern, the non-uniformity of the plasma, temperature variations across a substrate upon which deposition of the material proceeds, warpage of the substrate, and/or other process parameters. Non-uniformity in the thickness of the deposited film causes process variations in subsequent lithographic patterning process and/or etch process.

SUMMARY

According to an aspect of the present disclosure, an apparatus includes a vacuum enclosure, an electrostatic chuck comprising a plurality of temperature control zones located within the vacuum enclosure, and a plurality of spot lamp zones located below the respective temperature control zones, each of the spot lamp zones including at least one spot lamp located between a bottom portion of the vacuum enclosure and a backside surface of the electrostatic chuck.

According to another aspect of the present disclosure, an apparatus includes a vacuum enclosure, an electrostatic chuck embedding a plurality of conductive plates located within the vacuum enclosure, an upper electrode separated from the electrostatic chuck by a plasma zone, at least one RF power source electrically connected to at least one of the electrostatic chuck or the upper electrode, wherein the at least one RF power source is configured to generate a plasma in the plasma zone, and a plurality of plate bias circuits configured to independently electrically bias a respective one of the plurality of conductive plates with a different direct current bias voltage to obtain a more uniform electrostatic chucking force across the electrostatic chuck.

According to yet another aspect of the present disclosure, a method of operating a apparatus includes loading a substrate on the electrostatic chuck; flowing a precursor gas through the gas supply manifold into the vacuum enclosure; and depositing a film on the substrate by generating a radio frequency plasma of the precursor gas employing the radio frequency power source.

DETAILED DESCRIPTION

As discussed above, the present disclosure is directed to multi-zone plasma-enhanced chemical vapor deposition apparatuses and methods for operating the same, the various aspects of which are described herebelow in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Figure 1:
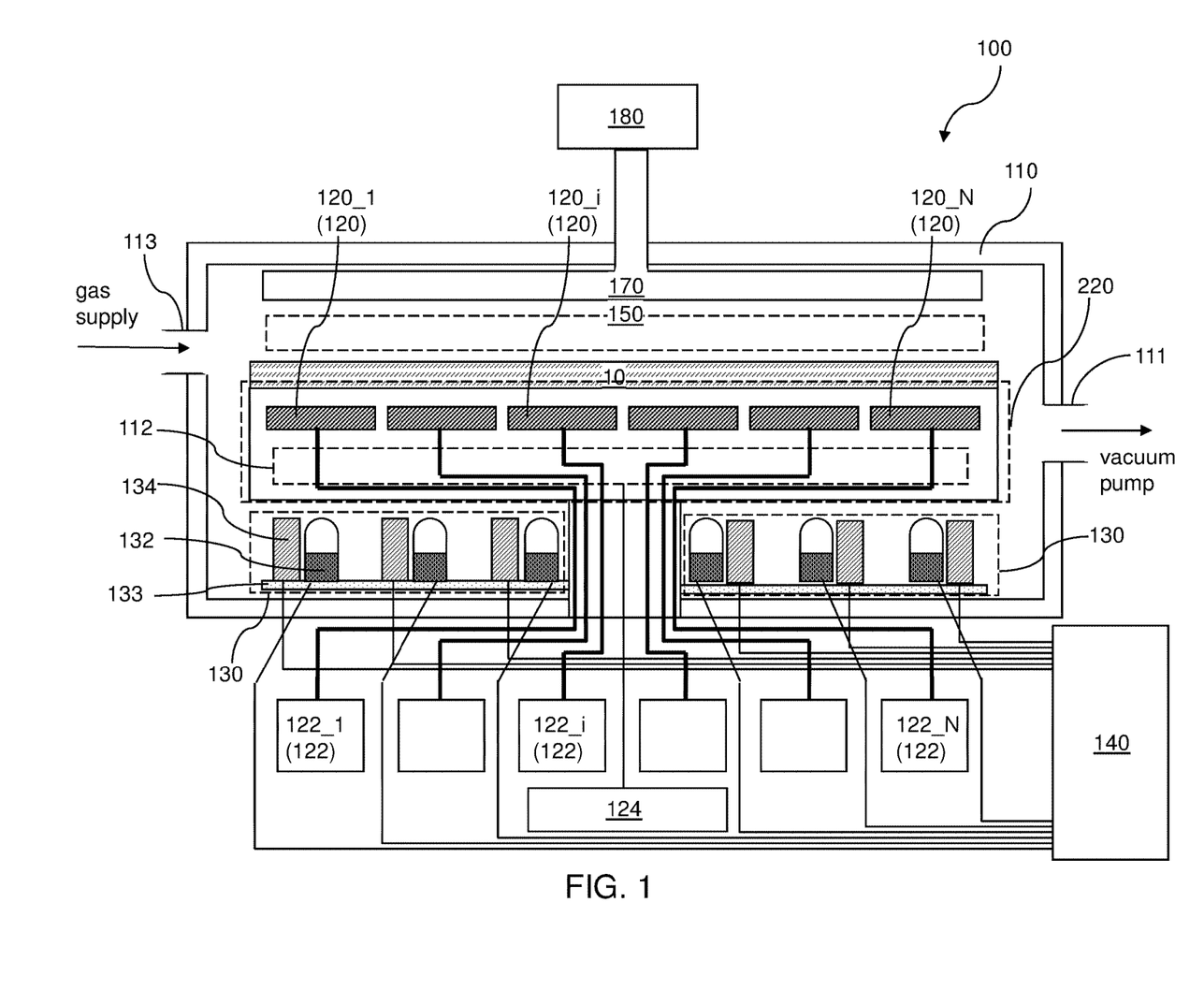
FIG. 1 is a vertical cross-sectional view of a first exemplary plasma enhanced chemical vapor deposition (PECVD) apparatus according to an embodiment of the present disclosure.

Referring to FIG. 1, a vertical cross-sectional view of a first exemplary plasma enhanced chemical vapor deposition (PECVD) apparatus 100 according to an embodiment of the present disclosure is illustrated. The first exemplary PECVD apparatus 100 includes a process chamber configured to perform a PECVD process. The process chamber of the first exemplary PECVD apparatus 100 includes a vacuum chamber defined by a vacuum enclosure 110. The vacuum enclosure 110 includes multiple components such as static enclosure walls and at least one sealable opening that can be sealed by a movable door or a movable cap. For example, an opening may be provided in a sidewall of the static enclosure walls, and a slit valve may be provided to enable transfer of a substrate (such as a semiconductor wafer) therethrough. The slit valve may be configured to move out of the path of the transfer of the substrate during the transfer of the substrate, and slide into a sealing position once the substrate transfer is complete. The opening in the static enclosure walls may be connected to a transfer chamber (not illustrated), which may be maintained under vacuum or under reduced pressure to minimize influx of contaminants into the vacuum chamber and to facilitate maintenance of the base pressure within the vacuum enclosure 110. At least one vacuum pump (not expressly shown) can be attached to the vacuum enclosure 110 through a pumping port 111. The at least one vacuum pump can be configured to maintain the base pressure of the vacuum enclosure 110 in a range from 0.01 mTorr to 1 mTorr after a suitable outgassing process. The at least one vacuum pump may include a tandem combination of a turbo pump and a mechanical pump. The mechanical pump may be connected to the exhaust of the turbo pump, and can function as a roughing pump. The intake side of the turbo pump can be connected to the pumping port 111 of the vacuum enclosure 110 to enable low base pressure in the vacuum enclosure 110.

A gas supply manifold 113 configured to provide influx of at least one process gas into the vacuum enclosure 110 may be provided in the first exemplary PECVD apparatus 100. The gas supply manifold 113 may be configured to provide influx of the at least one process gas through a sidewall of the vacuum enclosure 110 located on an opposite side of the pumping port. The at least one process gas may include any process gas that can be employed for any known PECVD process in the art. Optionally, the gas supply manifold may be configured to provide a carrier gas, a purge gas, and/or a backfill gas.

An electrostatic chuck 220 is located within the vacuum enclosure 110. The electrostatic chuck 220 includes a dielectric matrix having a planar top surface on which a semiconductor wafer 10 can be disposed. According to an aspect of the present disclosure, the electrostatic chuck 220 includes a plurality of conductive plates 120 that are electrically isolated from each other. According to an aspect of the present disclosure, the volume of the electrostatic chuck 220 can include a plurality of temperature control zones. The plurality of temperature control zones may have mutually exclusive volumes, and the sum of all volumes of the temperature control zones may be the same as the entire volumes of the electrostatic chuck 220. In one embodiment, each of the conductive plates 120 can be located within a respective one of the plurality of temperature control zones or overlapping the boundaries of plural temperature control zones.

Each temperature control zone may have a limited azimuthal angle range around a vertical axis passing through the geometrical center of the electrostatic chuck 220, and/or may have a limited radial distance range from the vertical axis passing through the geometrical center of the electrostatic chuck 220. As used herein, a geometrical center of an object refers to the center of gravity of a hypothetical object that occupies a same volume as the object and having a uniform density throughout. For example, the area of the electrostatic chuck 220 may be divided into J azimuthal angle ranges having different azimuthal angle ranges around the vertical axis passing through the geometrical center of the electrostatic chuck 220, and may have K radial distance zones having different radial distance ranges from the vertical axis passing through the geometrical center of the electrostatic chuck 220, thereby providing J×K temperature control zones.

According to an aspect of the present disclosure, the temperature of the plurality of temperature control zones may be independently controlled by a plurality of temperature control systems. The plurality of temperature control systems can independently operate such that the temperature of each temperature control zone is the same irrespective of variations in thermal conduction between the semiconductor wafer 10 and the various portions of the top surface of the electrostatic chuck 220 located in different temperature control zones. For example, a semiconductor wafer 10 with significant wafer warpage may have a large contact area in one temperature control zone and reduce the temperature of the corresponding temperature control zone instantaneously, while having a small contact area in another temperature control zone and does not reduce the temperature of the corresponding temperature control zone significantly. In this case, a temperature sensor that senses the temperature of the temperature control zone with a lowered temperature can generate a signal for increasing the heat output of a set of at least one spot lamp 132 directed to the temperature control zone with the lowered temperature. The spot lamp 132 may comprise any suitable heating lamp.

According to an aspect of the present disclosure, directed application of heat to a selected temperature control zone can be provided by employing a plurality of spot lamp zones including a respective set of spot lamps 132. Each spot lamp 132 is configured to direct radiation along a single direction such that the temperature of an illuminated area rises due to the heat generated from the radiation. The emission spectrum of each spot lamp 132 may be the same, and the heat energy of the emission spectrum may be concentrated in the visible wavelength range (from 400 nm to 800 nm), or may be concentrated in the infrared range. Each set of spot lamps 132 can be configured to heat a respective temperature control zone, and can be located between a bottom portion of the vacuum enclosure 110 and a backside surface of the electrostatic chuck 220. In other words, the spot lamps 132 are located outside the volume of the electrostatic chuck 220, and preferably vertically offset from the backside surface of the electrostatic chuck 220.

Figure 2:
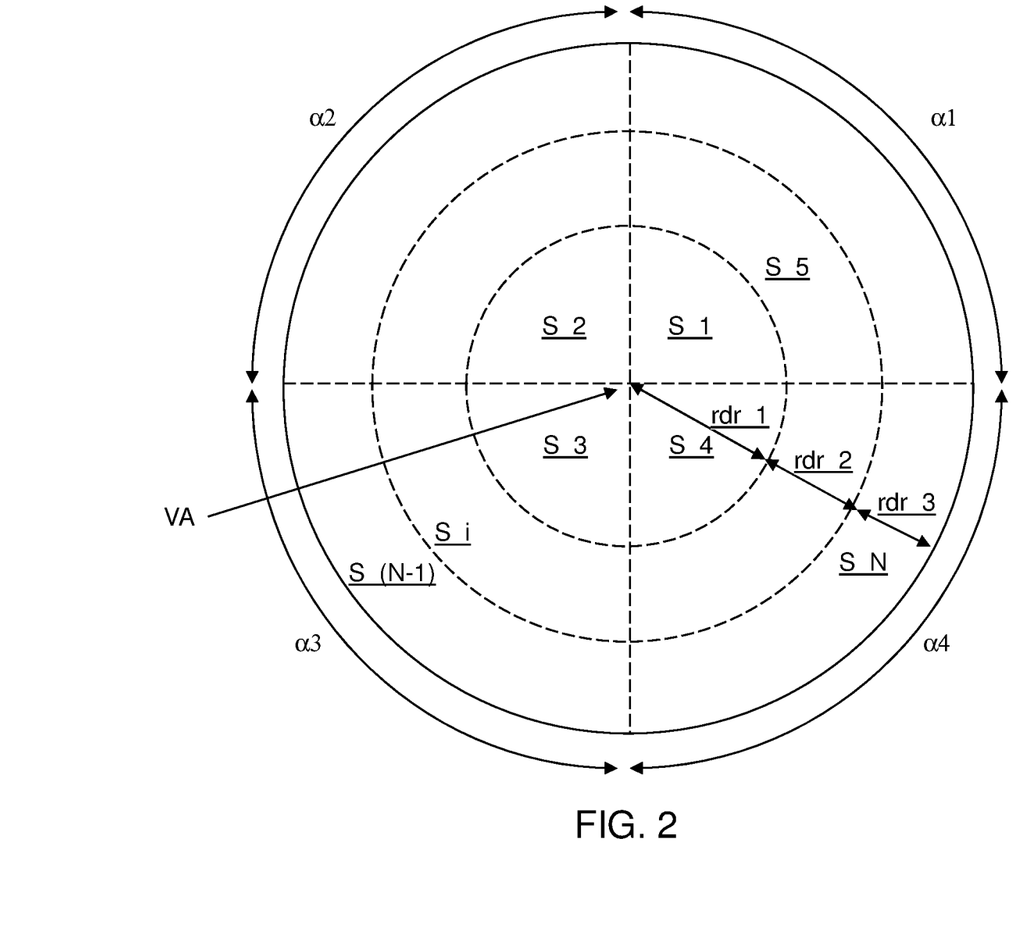
FIG. 2 is a top-down view of a plurality of spot lamp zones according to an embodiment of the present disclosure.

Referring to FIG. 2, an exemplary configuration for a plurality of spot lamp zones S_i is illustrated. Each spot lamp zone S_i may be numbered with a numerical index i that begins with 1. In this case, if a total of N spot lamp zones S_i are provided, the numerical index i may run from 1 to N. In one embodiment, the number N may be equal to J×K. In one embodiment, the plurality of spot lamp zones S_i can comprise at least two spot lamp zones S_i located within different azimuthal angle ranges around the vertical axis VA passing through the geometrical center of the electrostatic chuck 220. In one embodiment, the plurality of spot lamp zones S_i can comprise three or more spot lamp zones S_i having mutually non-overlapping azimuthal angle ranges around the vertical axis VA passing through the geometrical center of the electrostatic chuck 220. In an illustrative example, the total number of different azimuthal angle ranges can be an integer J that has a value in a range from 2 to 12. In this case, the difference between the maximum azimuthal angle and the minimum azimuthal angle within each azimuthal angle range α_j may be $2\pi/J-\delta$ radian, in which the index j runs from 1 to J, the integer J is in a range from 2 to 12, and the offset angle δ is in a range from 0.003 radian to 0.03 radian and is employed to ensure that neighboring conductive plates 120 do not contact each other. While FIG. 2 illustrates a configuration in which four azimuthal angle ranges are employed, embodiments are expressly contemplated herein in which a different number of azimuthal angle ranges is employed.

Additionally or alternatively, the plurality of spot lamp zones S_i can comprise two or more spot lamp zones S_i located within different radial distance ranges from the vertical axis VA passing through the geometrical center of the electrostatic chuck 220. In one embodiment, the two or more spot lamp zones S_i have mutually non-overlapping radial distance ranges from the vertical axis VA passing through the geometrical center of the electrostatic chuck 220. In an illustrative example, the total number of different radial distance ranges can be an integer K that has a value in a range from 2 to 6. In this case, the difference between the maximum radial distance and the minimum radial distance within each radial distance range rdr_k may be in a range from R/(2K) to 2R/K, in which R is the radius of the electrostatic chuck 220, and k is an integer index running from 1 to K. The value of K may be in a range from 2 to 6. The radial distance ranges of spot lamp zones S_i having a same azimuthal angle from the vertical axis VA passing through the geometrical center of the electrostatic chuck 220 do not overlap in order to prevent electrical shorts between neighboring pairs of conductive plates 120. While FIG. 2 illustrates a configuration in which three radial distance ranges are employed, embodiments are expressly contemplated herein in which a different number of radial distance ranges is employed.

The difference between the maximum radial distance and the minimum radial distance may be the same, or may be different, across different radial distance ranges. Further, areas within each radial distance range may be divided into a same number of azimuthal angle ranges or may be divided into different numbers of azimuthal angle ranges. For example, a radial distance range having a greater minimum radial distance may be divided into a greater number of azimuthal angle ranges than another radial distance range having a lesser minimum radial distance. Alternatively or additionally, the area including the geometrical center of the electrostatic chuck 220 may, or may not be divided into multiple spot lamp zones S_i. If the area including the geometrical center of the electrostatic chuck 220 is not divided into multiple spot lamp zones S_i, a circular single spot lamp zone may be provided in the area including the geometrical center of the electrostatic chuck 220.

In one embodiment, each pair of spot lamp zones S_i within the plurality of spot lamp zones S_i may differ from each other by at least one of an azimuthal angle range and a radial distance range.

Referring back to FIG. 1, a reflector 133 may be provided between the plurality of spot lamp zones S_i and the bottom portion of the vacuum enclosure 110, which can include a bottom plate of the vacuum enclosure 110.

Each temperature control zone of the electrostatic chuck 220 can be controlled by the spot lamps 132 provided in a corresponding spot lamp zone S_i. In one embodiment, there is only one spot lamp 132 provided in a corresponding spot lamp zone S_i. In another embodiment, plural spot lamps 132 are provided in a corresponding spot lamp zone S_i.

Generally, a temperature sensor array is provided in the first exemplary PECVD apparatus 100. The temperature sensor array can be configured to measure temperature of a respective temperature control zone among the plurality of temperature control zones. In one embodiment, the temperature sensor array can comprise an array of pyrometers 134 pointed at a respective area of a backside surface of the electrostatic chuck 220 that is located within a respective one of the plurality of temperature control zones. In other words, each pyrometer 134 can measure the temperature of a respective temperature control zone by detecting and analyzing the light spectrum emitted from the backside surface of a respective temperature control zone of the electrostatic chuck 220. In one embodiment, there is only one pyrometer 134 provided in a corresponding spot lamp zone S_i. In another embodiment, plural pyrometers 134 are provided in a corresponding spot lamp zone S_i. The combination of the spot lamps 132, the reflector 133 and the pyrometers 134 is herein referred to as an internal temperature control unit 130.

The measured temperature data from the pyrometers 134 can be transmitted to a temperature controller array 140 located outside the vacuum enclosure 110, and the temperature controller array 140 can generate temperature control signals that control the intensity of heat generated by each of the plurality of spot lamp zones. Generally the temperature controller array 140 includes a plurality of temperature controllers, and the total number of temperature controllers within the temperature controller array 140 can be at least the total number of spot lamp zones S_i, which can be the same as the total number of temperature control zones. In one embodiment, each temperature controller within the plurality of temperature controllers can be configured to independently control temperature of a respective temperature control zone. The temperature controller array 140 may comprise a controller board or an ASIC, or may comprise a computer running an automated temperature control program. Alternatively, if the temperature controller array 140 is a computer, then a single computer may function as the temperature controller array 140 for all N spot lamp zones S.

According to another aspect of the present disclosure, the electrostatic chuck 220 includes a plurality of conductive plates 120 located within a respective one of the plurality of temperature control zones within the volume of the chuck 220. The electrostatic chuck 220 can include a dielectric matrix that embeds the plurality of conductive plates 120. Each of the plurality of conductive plates 120 can have a respective top surface that is vertically spaced from the top surface of the electrostatic chuck 220 by a uniform vertical separation distance.

The conductive plates 120 can have a uniform thickness, and can include a same conductive material, such as a metallic material. Neighboring pairs of conductive plates 120 can be laterally spaced from each other by uniform spacing to prevent electrical shorts therebetween. In case the electrostatic chuck 220 has a circular horizontal cross-sectional shape, the conductive plates 120 can have a horizontal cross-sectional shape of a respective portion of the circular horizontal cross-sectional shape that is formed by dividing the circular horizontal cross-sectional shape with a uniform gap among the divided areas. Each divided area corresponds to the area of a respective one of the conductive plate zones. J×K conductive plates 120 may be provided in the electrostatic chuck 220. The number J may be in a range from 2 to 12, and the number K may be in a range from 2 to 6.

In one embodiment, the total number of conductive plates 120 can be the same as the total number N of the temperature control zones, which can be the same as the total number N of spot lamp zones $S\_i$. In one embodiment, the conductive plates 120 can be numerically numbered with a numerical suffix that is the same as the numerical suffix of the corresponding spot lamp zone. In this case, the integer index i for the spot lamp zones $S\_i$ can run from 1 to N, and the integer index for the conductive plates 120$\_i$ can run from 1 to N. Alternatively, the total number of conductive plates 120 can be different from the total number N of spot lamp zones $S\_i$.

Each of the plurality of conductive plates 120$\_i$ is independently electrically biased by a respective plate bias circuit 122 that provides a direct current bias voltage to the respective one of the conductive plates 120$\_i$. Each of the plate bias circuits 122 may be numerically numbered with the same numerical suffix as the numerical suffix of the conductive plate 120$\_i$ to which the plate bias circuit 122 is connected. The plurality of plate bias circuits 122$\_i$ can be configured to independently electrically bias a respective one of the plurality of conductive plates 120. The plate bias circuits 122 are electrically connected to a direct current (DC) power supply (not shown) which provides the DC power to the plate bias circuits 122.

Figure 3:
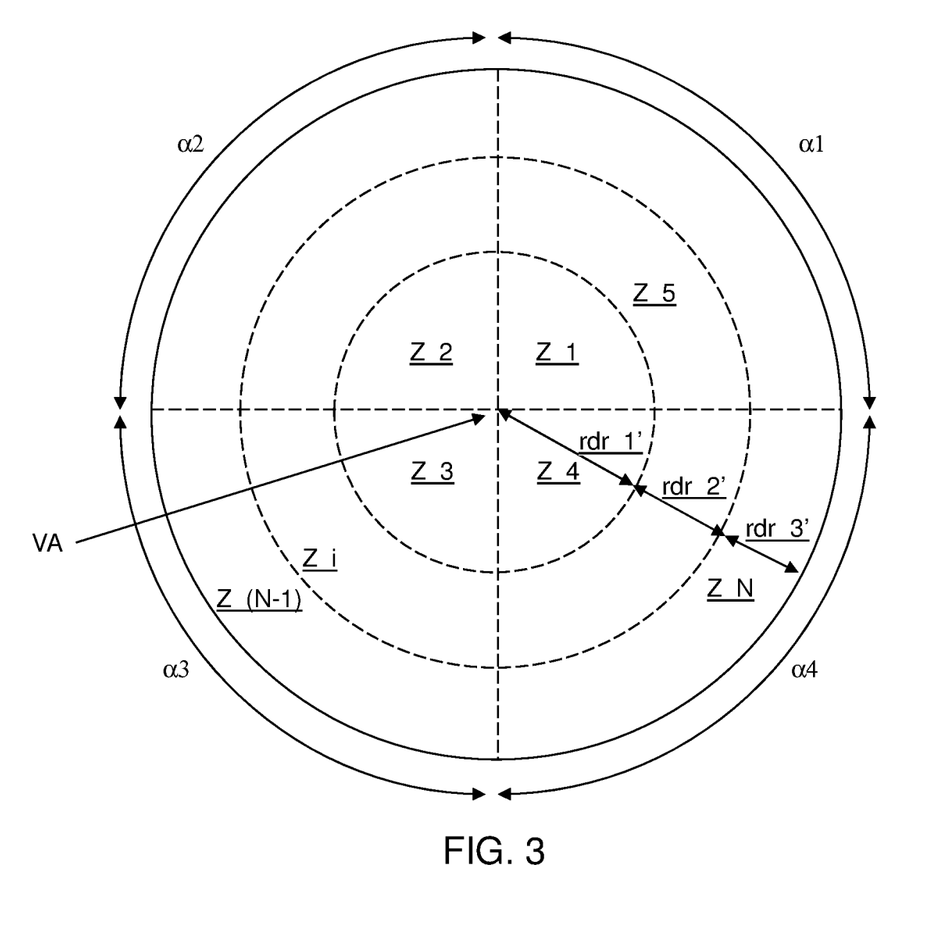
FIG. 3 is a top-down view of a plurality of conductive plates according to an embodiment of the present disclosure.

Referring to FIG. 3, an exemplary layout for the plurality of conductive plates 120$\_i$ is illustrated. The plurality of conductive plates 120$\_i$ can be located within a plurality of conductive plate zones $Z\_i$ (i.e., separate electrostatic chucking force zones) located within different azimuthal angle ranges αi around the vertical axis VA passing through the geometrical center VA of the electrostatic chuck 220. The conductive plate zones $Z\_i$ may correspond to the respective spot lamp zones $S\_i$, or they may have a different layout and/or area than the respective spot lamp zones $S\_i$.

Each conductive plate zone $Z\_i$ may be numbered with a numerical index i that begins with 1. In this case, if a total of N conductive plate zones $Z\_i$ are provided, the numerical index i may run from 1 to N. In one embodiment, the number N may be equal to J×K. In one embodiment, the plurality of conductive plate zones $Z\_i$ can comprise at least two conductive plate zones $Z\_i$ located within different azimuthal angle ranges around the vertical axis VA passing through the geometrical center of the electrostatic chuck 220. In one embodiment, the plurality of conductive plate zones $Z\_i$ can comprise three or more conductive plate zones $Z\_i$ having mutually non-overlapping azimuthal angle ranges around the vertical axis VA passing through the geometrical center of the electrostatic chuck 220.

In an illustrative example, the total number of different azimuthal angle ranges can be an integer J that has a value in a range from 2 to 12. In this case, the difference between the maximum azimuthal angle and the minimum azimuthal angle within each azimuthal angle range αj may be $2\pi/J-\delta$ radian, in which the index j runs from 1 to J, the integer J is in a range from 2 to 12, and the offset angle δ is in a range from 0.003 radian to 0.03 radian and is employed to ensure that neighboring conductive plates 120 do not contact each other. While FIG. 3 illustrates a configuration in which four azimuthal angle ranges are employed for the conductive plate zones $Z\_i$, embodiments are expressly contemplated herein in which a different number of azimuthal angle ranges is employed.

Additionally or alternatively, the plurality of conductive plate zones $Z\_i$ can comprise two or more conductive plate zones $Z\_i$ located within different radial distance ranges from the vertical axis VA passing through the geometrical center of the electrostatic chuck 220. In one embodiment, the two or more conductive plate zones $Z\_i$ have mutually non-overlapping radial distance ranges from the vertical axis VA passing through the geometrical center of the electrostatic chuck 220. In an illustrative example, the total number of different radial distance ranges can be an integer K that has a value in a range from 2 to 6. In this case, the difference between the maximum radial distance and the minimum radial distance within each radial distance range $rdr\_k$ may be in a range from R/(2K) to 2R/K, in which R is the radius of the electrostatic chuck 220, and k is an integer index running from 1 to K. The value of K may be in a range from 2 to 6.

The radial distance ranges of conductive plate zones $Z\_i$ having a same azimuthal angle from the vertical axis VA passing through the geometrical center of the electrostatic chuck 220 do not overlap in order to prevent electrical shorts between neighboring pairs of conductive plates 120. While FIG. 3 illustrates a configuration in which three radial distance ranges are employed for the conductive plate zones $Z\_i$, embodiments are expressly contemplated herein in which a different number of radial distance ranges is employed.

The difference between the maximum radial distance and the minimum radial distance may be the same, or may be different, across different radial distance ranges. Further, areas within each radial distance range may be divided into a same number of azimuthal angle ranges or may be divided into different numbers of azimuthal angle ranges. For example, a radial distance range having a greater minimum radial distance may be divided into a greater number of azimuthal angle ranges than another radial distance range having a lesser minimum radial distance.

Alternatively or additionally, the area including the geometrical center of the electrostatic chuck 220 may, or may not be divided into multiple conductive plate zones $Z\_i$. If the area including the geometrical center of the electrostatic chuck 220 is not divided into multiple conductive plate zones $Z\_i$, a circular single conductive plate zone may be provided in the area including the geometrical center of the electrostatic chuck 220.

In one embodiment, each pair of conductive plate zones $Z\_i$ within the plurality of conductive plate zones $Z\_i$ may differ from each other by at least one of an azimuthal angle range and a radial distance range. In one embodiment, the area of each conductive plate zone $Z\_i$ may be the same as the area of a corresponding spot lamp zone $S\_i$ having a same numerical index i for each value of the numerical index i within the range from 1 to N.

Each conductive plate 120$\_i$ is electrically connected to a respective one of the plate bias circuits 122$\_i$. An independently controllable direct current bias voltage can be applied to each conductive plate 120$\_i$ by a respective one of the plate bias circuits 122$\_i$ to provide a chucking force to the semiconductor wafer 10. For example, the direct current bias voltage applied to each conductive plate 120$\_i$ by the plate bias circuits 122$\_i$ may be in a range from 200 V to 2,000 V, such as from 400 V to 1,000 V. The direct current bias voltage may generate a voltage gradient in the dielectric matrix of the electrostatic chuck 220 between the conductive plates 120 and the semiconductor wafer 10. The voltage gradient causes surface charges to accumulate on the bottom surface of the semiconductor wafer 10, which causes the semiconductor wafer 10 to be held on the chuck 220 by an electrostatic chucking force.

Further, each of the plurality of plate bias circuits 122_i can be configured to increase an electrostatic chucking force generated by the respective conductive plate 120_i in response to measured decrease in the chucking force, and to decrease the electrostatic chucking force generated by the respective conductive plate 120_i in response to measured increase in the chucking force generated by the respective conductive plate 120_i. Thus, the chucking force in each of the conductive plate zones Z_i may be independently controlled by applying a different voltage to the conductive plates in different zones to obtain a substantially uniform chucking force across all conductive plate zones.

In one embodiment, capacitance meters can be employed to measure the chucking force of each conductive plate 120_i by measuring the capacitance between the respective conductive plate 120_i and the semiconductor wafer 10.

Figure 4:
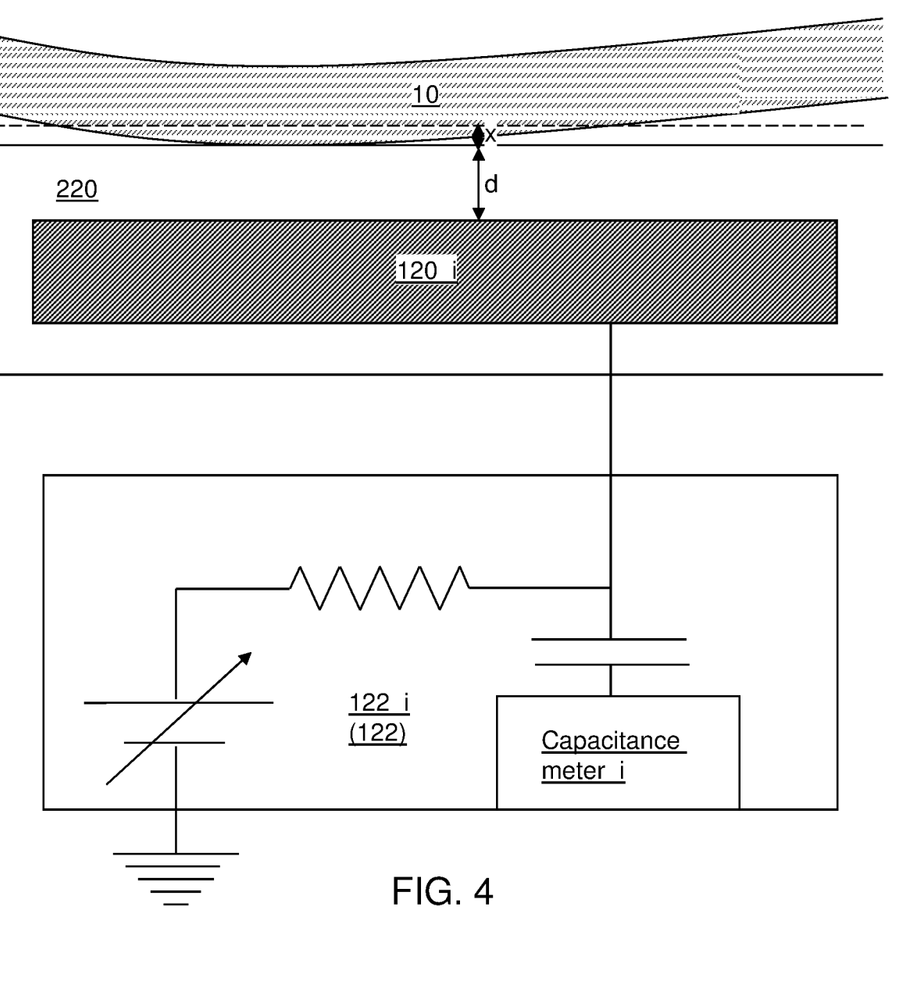
FIG. 4 is a magnified view of a region including a conductive plate, a capacitance meter, and a direct current electrical bias voltage circuit according to an embodiment of the present disclosure.

Referring to FIG. 4, a circuit schematic for one of the plate bias circuits 122_i is illustrated. The uniform distance between the top surface of the i-th conductive plate 120_i and the planar top surface of the electrostatic chuck 220 is d. The effective spacing between the planar top surface of the electrostatic chuck 220 and the curved bottom surface of the semiconductor wafer 10 induced by inherent warpage of the semiconductor wafer 10 can be x. The warpage of the semiconductor wafer 10 may be caused by stress of semiconductor devices (not shown) that are present on a top surface of the semiconductor wafer 10 and/or by variation in surface roughness of the top surface of the chuck 220. The area of the i-th conductive plate 120_i can be A. In this case, the capacitance C between the i-th conductive plate 120_i and the semiconductor wafer 10 is given by $C=A/(x/\varepsilon_0+d/\varepsilon)$, in which $\varepsilon_0$ is the permittivity of vacuum and $\varepsilon$ is the permittivity of the dielectric material of the electrostatic chuck 220.

Each conductive plate 120_i can be biased employing a series connection of an independently controlled voltage source and a resistor. A capacitance meter can be connected to the electrical node of each conductive plate 120_i through a coupling capacitor, and the capacitance between each conductive plate 120_i and the semiconductor wafer 10 can be measured by the capacitance meter upon disposing the semiconductor wafer 10 on the electrostatic chuck 220.

Generally, each of the plurality of plate bias circuits 122_i can comprise a respective capacitance meter that measures capacitance between a respective conductive plate and the semiconductor wafer 10. In one embodiment, each of the plurality of plate bias circuits 122_i can be configured to adjust a voltage to the respective conductive plate 120_i in response to a change in measured capacitance in the respective capacitance meter. In one embodiment, each of the plurality of plate bias circuits 122_i can be configured to decrease the applied voltage to the respective conductive plate 120_i in response to an increase in the measured capacitance in the respective capacitance meter, and to increase the applied voltage to the respective conductive plate 120_i in response to a decrease in the measured capacitance in the respective capacitance meter.

Generally, each of the plurality of plate bias circuits 122_i can be configured to increase the chucking force generated by the respective conductive plate 120_i in response to a decrease in measured capacitance from the respective capacitance meter, and to decrease the chucking force generated by the respective conductive plate 120_i in response to an increase in the measured capacitance from the respective capacitance meter. Thus, uniform chucking force can be applied to each part of the semiconductor wafer 10 that extend over the multiple conductive plates 120_i.

Referring back to FIG. 1, a lower electrode 112 can be embedded in the electrostatic chuck 220, and can be connected to a bottom radio frequency (RF) power source 124, which can be configured to provide bottom radio frequency (RF) power for plasma enhanced chemical deposition (PECVD) processes to be performed in the first exemplary apparatus 100. Further, an upper electrode 170 can be located within the vacuum enclosure 110, can overlie the electrostatic chuck 220, and can be connected to a top radio frequency power source 180. Generally, at least one RF power source (124, 180) can be provided, which is configured to apply a radio frequency signal for generating a plasma into the vacuum enclosure 110 in a plasma zone 150, which is located between the electrostatic chuck 220 and the upper electrode 170.

Figure 5:
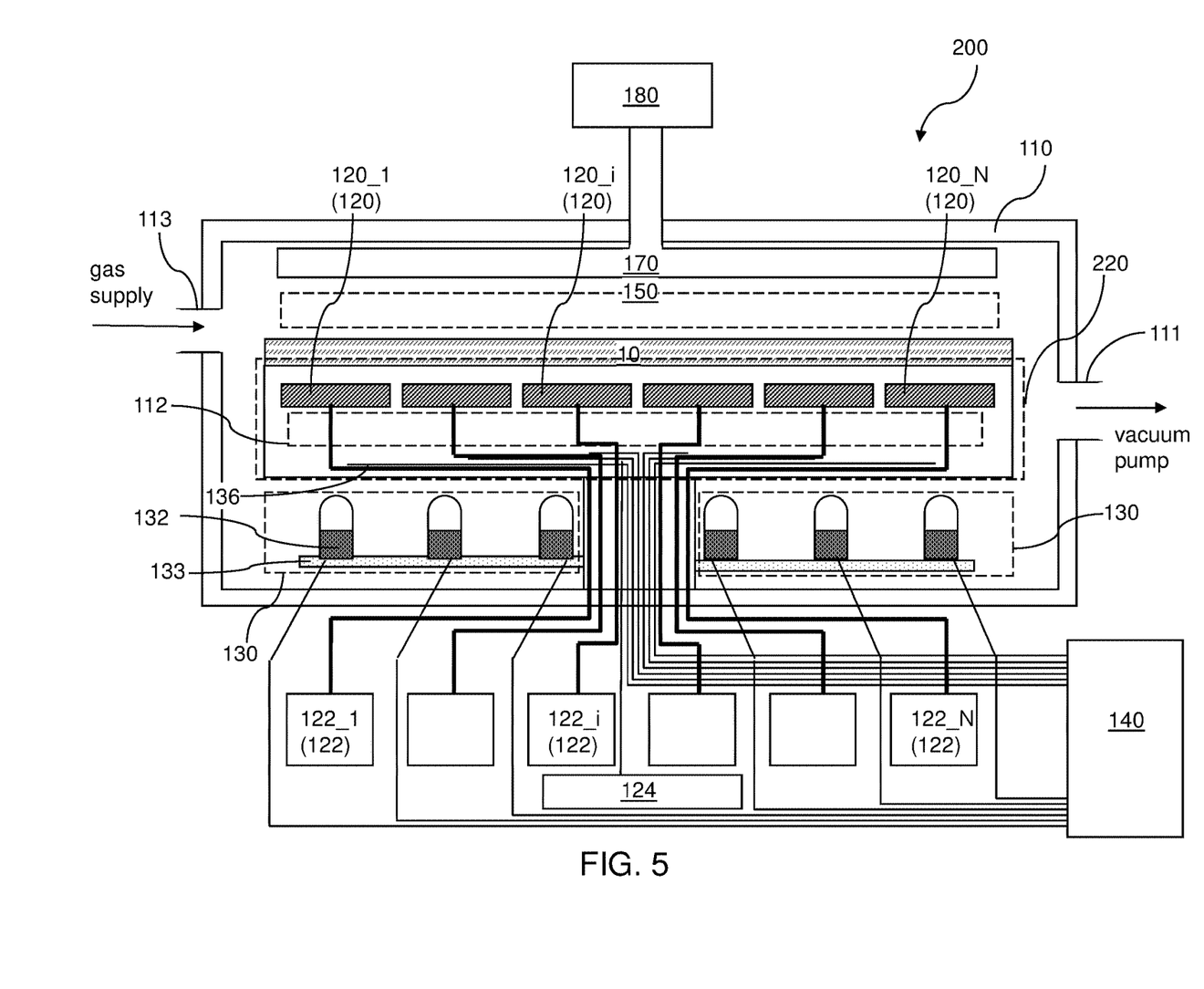
FIG. 5 is a vertical cross-sectional view of a second exemplary PECVD apparatus according to an embodiment of the present disclosure.

Referring to FIG. 5, a second exemplary PECVD apparatus 200 according to an embodiment of the present disclosure can be derived from the first exemplary PECVD apparatus 100 of FIG. 1 by replacing the pyrometers 134 with thermocouples 136. In this case, the temperature sensor array comprises an array of thermocouples 136 configured to provide temperature measurement points located inside the electrostatic chuck 220 within a respective one of the temperature control zones. In one embodiment, each of the temperature control zones can have a respective measurement point at which two thermocouple wires of a thermocouple 136 are adjoined to each other.

While the embodiments shown in FIGS. 1 and 5 illustrate apparatuses which contain both the conductive plates 120 and the spot lamps 132, it should be noted that the apparatus may include either the conductive plates 120 or the spot lamps 132, while the other ones of the conductive plates 120 or the spot lamps 132 are omitted. Furthermore, while FIGS. 1 and 5 illustrate PECVD apparatuses, the independently controllable temperature zones and/or chucking force zones may be used in other apparatuses that contain an electrostatic chuck, such as other atomic layer deposition or plasma etching apparatuses.

Referring to all drawings and according to various embodiments of the present disclosure, a method of operating an apparatuses of embodiments of the present disclosure is provided. A substrate such as a semiconductor wafer 10 can be disposed on the electrostatic chuck 220. A precursor gas for a PECVD or other layer deposition process can be flowed through the gas supply manifold into the vacuum enclosure 110. A film can be deposited on the substrate by generating a radio frequency plasma of the precursor gas employing at least one radio frequency power source (124, 180), which can include the upper RF power source 180 and/or the lower RF power source 124.

The electrostatic chuck 220 can include a plurality of temperature control zones of which the temperature can be controlled independently. The temperature control zones can correspond to, and may have the same area as, a respective one of the spot lamp zones S_i. Generally, each pair of spot lamp zones S_i within the plurality of spot lamp zones S_i differ from each other by at least one of an azimuthal angle range and a radial distance range. In one embodiment, temperature of each of the plurality of temperature control zones employing a temperature controller array 140. The temperature controller array 140 can be configured to control intensity of heat generated by each of the plurality of spot lamp zones S_i.

Generally, variations in temperature can be reduced across the plurality of spot lamp zones S_i by independently controlling power input into each spot lamp zone S_i based on temperature readout data generated by a temperature sensor array, which may be embodied as pyrometers 134 or may be embodied as thermocouples 136. In one embodiment, the temperature sensor array may comprises an array of pyrometers 134 pointed at a respective area of a backside surface of the electrostatic chuck 220 that is located within a respective one of the plurality of temperature control zones. Alternatively, the temperature sensor array may comprises thermocouples 136 having temperature measurement points within a respective one of the plurality of temperature control zones inside the electrostatic chuck 220

In one embodiment, a PECVD apparatus (100,200) can comprise a plurality of plate bias circuits 122 including a respective capacitance meter. Capacitance between each of the plurality of conductive plates 120_i and a semiconductor wafer 10 on the electrostatic chuck 220 can be measured. Voltages can be applied to the plurality of conductive plates 120_i based on measured values of the capacitance between each of the plurality of conductive plates 120_i and the semiconductor wafer 10 such that the chucking force is uniform across the entirety of the semiconductor wafer 10 despite the variations in the height of the bottom surface of the semiconductor wafer 10 from the planar top surface of the electrostatic chuck 220 (which can be caused by warpage of the semiconductor wafer 10).

In one embodiment, the uniform chucking force between the electrostatic chuck 220 and the semiconductor wafer 10 can be provided by decreasing a direct current electrical bias voltage to a respective conductive plate 120_i in response to an increase in measured capacitance in a respective capacitance meter, and by increasing the direct current electrical bias voltage to the respective conductive plate 120_i in response to a decrease in the measured capacitance in the respective capacitance meter. In this case, the chucking force generated by a respective conductive plate 120_i can be increased in response to a decrease in measured capacitance from a respective capacitance meter, and/or the chucking force generated by the respective conductive plate 120_i can be decreased in response to an increase in the measured capacitance from the respective capacitance meter.

Generally, the area of a conductive plate 120_i defines the area of a conductive plate zone. The area of each temperature control zone may, or may not, coincide with the area of a respective spot lamp zone S_i. The area of each temperature control zone may, or may not, coincide with the area of a conductive plate zone Z_i. As such, the area of each spot lamp zone S_i may, or may not, coincide with the area of a conductive plate zone Z_i.

Spot lamp zones S_i within each pair of spot lamp zones S_i within the plurality of spot lamp zones S_i differ from each other by at least one of an azimuthal angle range and a radial distance range. Each temperature control zone can coincide with a respective one of the spot lamp zones S_i. Conductive plate zones within each pair of conductive plate zones Z_i within the plurality of conductive plate zones Z_i differ from each other by at least one of an azimuthal angle range and a radial distance range. While the present disclosure is described employing embodiments in which the area of each spot lamp zone S_i coincide with the area of a respective conductive plate zone Z_i, embodiments are expressly contemplated herein in which the areas of the spot lamp zones S_i do not coincide with areas of the conductive plate zones Z_i, The apparatus of the present disclosure can be operated irrespective of whether the areas of the spot lamp zones S_i coincide with areas of the conductive plate zones Z_i or not.

The various embodiments of the present disclosure can be employed to provide uniform temperature across the entire area of a substrate over an electrostatic chuck 220 in a deposition or etching apparatus despite non-uniform thermal contact between the substrate and a planar top surface of the electrostatic chuck 220, and/or to provide uniform chucking force between the substrate and the electrostatic chuck 220 despite non-uniform distance between a backside surface of the substrate and the planar top surface of the electrostatic chuck 220. As such, a uniform film can be deposited across the entire top surface of the substrate employing the PECVD apparatuses of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. An apparatus, comprising:
a vacuum enclosure;
an electrostatic chuck embedding a plurality of conductive plates located within the vacuum enclosure, wherein the electrostatic chuck has a total area that is divided into J limited azimuthal angle ranges having different ranges for an azimuthal angle around a vertical axis passing through a geometrical center of the electrostatic chuck, wherein J is an integer in a range from 2 to 12, the electrostatic chuck comprises a plurality of temperature control zones, and each of the plurality of temperature control zones is located entirely within a respective one of the J limited azimuthal angle ranges, wherein each conductive plate of the plurality of conductive plates is located within a respective one of the plurality of temperature control zones;
an upper electrode separated from the electrostatic chuck by a plasma zone;
at least one RF power source electrically connected to at least one of the electrostatic chuck or the upper electrode, wherein the at least one RF power source is configured to generate a plasma in the plasma zone; and
a plurality of plate bias circuits configured to independently electrically bias a respective one of the plurality of conductive plates with a different direct current bias voltage to obtain a more uniform electrostatic chucking force across the electrostatic chuck.

2. The apparatus of claim 1, wherein the plurality of conductive plates are located within a plurality of conductive plate zones located within the respective one of the J limited azimuthal angle ranges around the vertical axis passing through a geometrical center of the electrostatic chuck.

3. The apparatus of claim 2, wherein the plurality of conductive plate zones comprises three or more conductive plate zones having mutually non-overlapping azimuthal angle ranges around the vertical axis passing through the geometrical center of the electrostatic chuck.

4. The apparatus of claim 2, wherein the plurality of conductive plate zones comprises two or more conductive plate zones located within different radial distance ranges from the vertical axis passing through the geometrical center of the electrostatic chuck.

5. The apparatus of claim 4, wherein the two or more conductive plate zones have mutually non-overlapping radial distance ranges from the vertical axis passing through the geometrical center of the electrostatic chuck.

6. The apparatus of claim 4, wherein each pair of conductive plate zones within the plurality of conductive plate zones differ from each other by at least one of an azimuthal angle range and a radial distance range.

7. The apparatus of claim 1, wherein each of the plurality of plate bias circuits comprises a respective capacitance meter that is configured to measure capacitance between a respective conductive plate and a semiconductor wafer located on the electrostatic chuck.

8. The apparatus of claim 7, wherein each of the plurality of plate bias circuits is configured to adjust a direct current bias voltage to the respective conductive plate in response to a change in measured capacitance in the respective capacitance meter.

9. The apparatus of claim 8, wherein each of the plurality of plate bias circuits is configured to:
decrease the direct current bias voltage to the respective conductive plate in response to an increase in the measured capacitance in the respective capacitance meter; and
increase the direct current bias voltage to the respective conductive plate in response to a decrease in the measured capacitance in the respective capacitance meter.

10. The apparatus of claim 7, wherein each of the plurality of plate bias circuits is configured to:
increase a chucking force generated by the respective conductive plate in response to a decrease in measured capacitance from the respective capacitance meter; and
decrease the chucking force generated by the respective conductive plate in response to an increase in the measured capacitance from the respective capacitance meter.

11. The apparatus of claim 1, further comprising:
a gas supply manifold configured to provide influx of gas into the vacuum enclosure; and
a pumping port connected to the vacuum enclosure.

12. The apparatus of claim 1, further comprising:
a plurality of spot lamp zones, wherein each of the spot lamp zones includes at least one spot lamp located between a bottom portion of the vacuum enclosure and a backside surface of the electrostatic chuck;
a temperature sensor array configured to independently measure temperature of each of the spot lamp zones; and
a temperature controller configured to control intensity of heat generated by each of the plurality of spot lamps.

13. The apparatus of claim 12, wherein the temperature sensor array comprises an array of pyrometers pointed at a respective area of a backside surface of the electrostatic chuck that is located within a respective one of the plurality of spot lamp zones.

14. The apparatus of claim 12, wherein the temperature sensor array comprises an array of thermocouples including temperature measurement points located inside the electrostatic chuck below a respective one of the spot lamp zones.

15. The apparatus of claim 12, wherein the temperature controller is configured to independently control temperature of a respective spot lamp zone.

16. The apparatus of claim 1, further comprising a plurality of spot lamp zones located below the respective temperature control zones, wherein each of the spot lamp zones includes at least one spot lamp located between a bottom portion of the vacuum enclosure and a backside surface of the electrostatic chuck and configured to heat a respective temperature control zone of the plurality of temperature control zones by directing heat output therefrom to the respective temperature control zone while a substrate is present over the electrostatic chuck during operation of the apparatus.

17. The apparatus of claim 16, wherein a total number of the plurality of conductive plates is the same as a total number of the plurality of spot lamp zones.

18. The apparatus of claim 16, further comprising a plurality of temperature control systems, wherein each of the plurality of temperature control systems is configured to independently control temperature of a respective temperature control zone of the plurality of temperature control zones by controlling a respective spot lamp zone of the plurality of spot lamp zones while the substrate is present over the electrostatic chuck during the operation of the apparatus.

19. The apparatus of claim 18, wherein:
the plurality of temperature control systems comprises an array of pyrometers pointed at a respective area of a backside surface of the electrostatic chuck and located within a respective one of the plurality of spot lamp zones; and
each pyrometer within the array of pyrometers is pointed at the respective temperature control zone while the substrate is present over the electrostatic chuck during the operation of the apparatus.

20. The apparatus of claim 1, wherein each of the plurality of conductive plates is located entirely in the respective one of the J limited azimuthal angle ranges.

* * * * *